US012492485B2

(12) United States Patent
Li et al.

(10) Patent No.: US 12,492,485 B2
(45) Date of Patent: Dec. 9, 2025

(54) HEAT LEAKAGE PREVENTION DEVICE AND SINGLE CRYSTAL FURNACE SYSTEM

(71) Applicant: TCL ZHONGHUAN RENEWABLE ENERGY TECHNOLOGY CO., LTD, Tianjin (CN)

(72) Inventors: Xiaodong Li, Tianjin (CN); Lei An, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 0 days.

(21) Appl. No.: 18/040,114

(22) PCT Filed: Nov. 28, 2022

(86) PCT No.: PCT/CN2022/134546
§ 371 (c)(1),
(2) Date: Jan. 31, 2023

(87) PCT Pub. No.: WO2023/185033
PCT Pub. Date: Oct. 5, 2023

(65) Prior Publication Data

US 2024/0247401 A1 Jul. 25, 2024

(30) Foreign Application Priority Data

Mar. 31, 2022 (CN) ......................... 202220731303.0

(51) Int. Cl.
*C30B 35/00* (2006.01)
*C30B 15/14* (2006.01)

(52) U.S. Cl.
CPC .................................... *C30B 15/14* (2013.01)

(58) Field of Classification Search
CPC ......... C30B 15/00; C30B 15/14; C30B 15/20; C30B 15/206; C30B 15/22; C30B 35/00; C30B 35/002
(Continued)

(56) References Cited

U.S. PATENT DOCUMENTS

2013/0143173 A1* 6/2013 Goshe ..................... C30B 11/00 432/248
2022/0170177 A1* 6/2022 Ou ............................ F27D 3/10
2024/0287703 A1* 8/2024 Zhu ......................... C30B 29/06

FOREIGN PATENT DOCUMENTS

AU 2020289881 B1 11/2021
CN 212128337 U 12/2020
(Continued)

OTHER PUBLICATIONS

International Search Report in International application No. PCT/CN2022/134546, mailed on Jan. 18, 2023.
(Continued)

*Primary Examiner* — Kenneth A Bratland, Jr.
(74) *Attorney, Agent, or Firm* — PV IP PC; Christopher S. Ruprecht; Wei Te Chung

(57) ABSTRACT

The present disclosure provides a heat leakage prevention device for a single crystal furnace and a single crystal furnace system including the heat leakage prevention device, wherein the heat leakage prevention device includes a thermal field structure and a plugging device disposed on an outer side of the single crystal furnace, the thermal field structure is provided with a thermal field open for feeding the single crystal furnace, the plugging device is disposed on a side of the thermal field structure close to the single crystal furnace, and the plugging device is movably disposed to expose or completely plug the thermal field open.

20 Claims, 3 Drawing Sheets

(58) Field of Classification Search
USPC ... 117/11, 13, 200, 206, 208, 217–218, 928, 117/931–932
See application file for complete search history.

(56) References Cited

FOREIGN PATENT DOCUMENTS

| | | | |
|---|---|---|---|
| CN | 113337884 | A | 9/2021 |
| CN | 215800033 | U | 2/2022 |
| CN | 217077852 | U | 7/2022 |

OTHER PUBLICATIONS

Written Opinion of the International Search Authority in International application No. PCT/CN2022/134546, mailed on Jan. 18, 2023.
Saudi Arabian Office Action issued in corresponding Saudi Arabian Patent Application No. 523450458 dated Jul. 17, 2025.

* cited by examiner

HEAT LEAKAGE PREVENTION DEVICE AND SINGLE CRYSTAL FURNACE SYSTEM

CROSS-REFERENCE TO RELATED APPLICATION

This application claims priority to and the benefit of Chinese Patent Application No. 202220731303.0, filed in the China National Intellectual Property Administration on Mar. 31, 2022, the disclosure of which is incorporated herein by reference in its entirety.

FIELD OF INVENTION

The present disclosure belongs to the technical field of single crystal production, and more particularly, relates to a heat leakage prevention device for preventing deterioration of thermal insulation performance of a single crystal furnace when an external recharging device is used for feeding, and a single crystal furnace system equipped with the heat leakage prevention device.

BACKGROUND

In recent years, the photovoltaic industry has developed rapidly. In an environment in which the photovoltaic industry pursues low cost and high efficiency, the reduction of waste of working hours and the improvement of utilization rate of working hours may effectively increase the productivity, and thus reduce costs and improve market competitiveness. The means in reducing cost of single crystal mainly includes the application of new technologies and processes such as high pulling speed, large loading, multiple crystal pulling, and matched new thermal field materials. The working hours of recharging in use of existing 36-inch thermal field structure account for 12.6%-15.4% of the total running time, wherein the working hours of single crystal slow cooling and recharging are invalid (no yield). Currently, the single-barrel recharging working hours (excluding the time of slow cooling and stabilization) are 1.92 h, and the recharging needs more personnel, and high labor intensity. Therefore, reducing recharging working hours and labor intensity can effectively improve theoretical production capacity.

However, when combined with an external recharging device, the thermal field (e.g., insulation cylinder and insulation felt) needs to be opened. The opening may cause poor insulation, heat loss and change in airflow direction, thereby affecting power consumption and crystal formation.

SUMMARY

In view of the above problems, the present disclosure provides a heat leakage prevention device and a single crystal furnace system suitable for a single crystal furnace to solve the above or other problems existing in the prior art.

In order to solve the above technical problems, the technical solution adopted by the present disclosure is a heat leakage prevention device for a single crystal furnace, wherein the heat leakage prevention device includes a thermal field structure and a plugging device disposed on an outside of the single crystal furnace, the thermal field structure is provided with a thermal field open for feeding the single crystal furnace, and the plugging device is disposed on a side of the thermal field structure close to the single crystal furnace, wherein the plugging device is movably disposed to expose or completely plug the thermal field open.

According to another feature of an embodiment of the present disclosure, the plugging device includes a plugging member, and the plugging member includes a main body and a protrusion connected to the main body; the protrusion is disposed on one side of the main body to position the main body at the thermal field open; and a shape of the main body is matched with a shape of a corresponding side of the thermal field structure to completely plug the thermal field open.

According to another feature of an embodiment of the present disclosure, a side surface area of the main body facing the thermal field open is larger than an area of the thermal field open.

According to another feature of an embodiment of the present disclosure, the protrusion is disposed at a lower end of the main body, and when the plugging device moves in a vertical direction, the protrusion is in close contact with a portion of the thermal field structure below the thermal field open.

According to another feature of an embodiment of the present disclosure, the protrusion is concave in a direction away from the thermal field open with respect to the main body.

According to another feature of an embodiment of the present disclosure, the thermal field structure includes an upper thermal insulation layer and a middle thermal insulation layer located below the upper thermal insulation layer, wherein the thermal field open is disposed between the upper thermal insulation layer and the middle thermal insulation layer; wherein the middle insulating layer is convex toward the single crystal furnace relative to the upper insulating layer.

According to another feature of an embodiment of the present disclosure, a concave portion of the protrusion is matched with a convex portion of the middle insulating layer, and a length of the concave portion is equal to a length of the convex portion.

According to another feature of an embodiment of the present disclosure, the plugging device further includes a connecting member; wherein one end of the connecting member is connected to a device for moving it, and the other end of the connecting member is connected to the plugging device; and the connecting member extends in the vertical direction to guide the plugging device to move in the vertical direction.

According to another feature of an embodiment of the present disclosure, a material of the plugging device is consistent with a material of the upper insulating layer.

The present disclosure also provides a single crystal furnace system including a guide cylinder lifting device, a heat leakage prevention device and a single crystal furnace, wherein: the heat leakage prevention device includes a thermal field structure and a plugging device disposed on an outside of the single crystal furnace, the thermal field structure is provided with a thermal field open for feeding the single crystal furnace, and the plugging device is disposed on a side of the thermal field structure close to the single crystal furnace, wherein the guide cylinder lifting device is disposed at an upper end of the heat leakage preventing device and is connected to the plugging device to guide the plugging device to move, wherein the single crystal furnace is disposed on an inner side of the heat leakage prevention device and is provided with a first open at a position corresponding to a position of the thermal field open.

According to another feature of an embodiment of the present disclosure, the plugging device includes a plugging member, and the plugging member includes a main body and a protrusion connected to the main body; the protrusion is disposed on one side of the main body to position the main body at the thermal field open; and a shape of the main body is matched with a shape of a corresponding side of the thermal field structure to completely plug the thermal field open.

According to another feature of an embodiment of the present disclosure, a side surface area of the main body facing the thermal field open is larger than an area of the thermal field open.

According to another feature of an embodiment of the present disclosure, the protrusion is disposed at a lower end of the main body, and when the plugging device moves in a vertical direction, the protrusion is in close contact with a portion of the thermal field structure below the thermal field open.

According to another feature of an embodiment of the present disclosure, the protrusion is concave in a direction away from the thermal field open with respect to the main body.

According to another feature of an embodiment of the present disclosure, the thermal field structure includes an upper thermal insulation layer and a middle thermal insulation layer located below the upper thermal insulation layer, wherein the thermal field open is disposed between the upper thermal insulation layer and the middle thermal insulation layer; wherein the middle insulating layer is convex toward the single crystal furnace relative to the upper insulating layer.

According to another feature of an embodiment of the present disclosure, a concave portion of the protrusion is matched with a convex portion of the middle insulating layer, and a length of the concave portion is equal to a length of the convex portion.

According to another feature of an embodiment of the present disclosure, the plugging device further includes a connecting member; wherein one end of the connecting member is connected to a device for moving it, and the other end of the connecting member is connected to the plugging device; and the connecting member extends in the vertical direction to guide the plugging device to move in the vertical direction.

According to another feature of an embodiment of the present disclosure, a material of the plugging device is consistent with a material of the upper insulating layer.

The present disclosure also provides a use of a heat leakage prevention device in a single crystal furnace for preventing heat loss.

According to another feature of an embodiment of the present disclosure, the heat leakage prevention device includes a thermal field structure and a plugging device disposed on an outside of the single crystal furnace, the thermal field structure is provided with a thermal field open for feeding the single crystal furnace, and the plugging device is disposed on a side of the thermal field structure close to the single crystal furnace, wherein the plugging device is movably disposed to expose or completely plug the thermal field open.

Due to the technical schemes, the heat leakage prevention device is simple in structure and convenient to use, the plugging device of the heat leakage prevention device is connected with the guide cylinder lifting mechanism, so that the plugging device can move under the action of the guide cylinder lifting mechanism, and the plugging device can be raised or dropped; the plugging device can plug the thermal field open when the recharging is not carried out to avoid the loss of heat and the change of gas direction in the single crystal furnace during the process of crystal pulling. When recharging is needed, the plugging device is lifted by the guide cylinder lifting mechanism so that the external recharging device can enter the single crystal furnace for recharging, and the external recharging device will not contact with the guide cylinder, and the guide cylinder lifting mechanism can drive both the guide cylinder and the plugging device to ensure that the recharging action is carried out.

The plugging device includes a main body and a protrusion, and the area of the main body is larger than the area of the thermal field open, so that the main body can completely plug the thermal field open, and the main body is overlapped a side of the upper thermal insulation layer, so as to avoid heat loss from a gap between the thermal field open and the main body. The protrusion plugs the contact gap between the main body and the middle thermal insulation layer to avoid heat loss from the contact gap, so as not to produce heat leakage. It also ensures that the direction of airflow in the single crystal furnace will not change.

BRIEF DESCRIPTION OF DRAWINGS

In order to more clearly illustrate the technical solutions in the embodiments of the present disclosure, reference will now be made briefly below to the accompanying drawings required for the description of the embodiments. It will be apparent that the accompanying drawings in the following description are merely some of the embodiments of the present disclosure, and other drawings may be obtained based on these drawings to those skilled in the art without involving any inventive effort.

In the figures.

Figure 1:
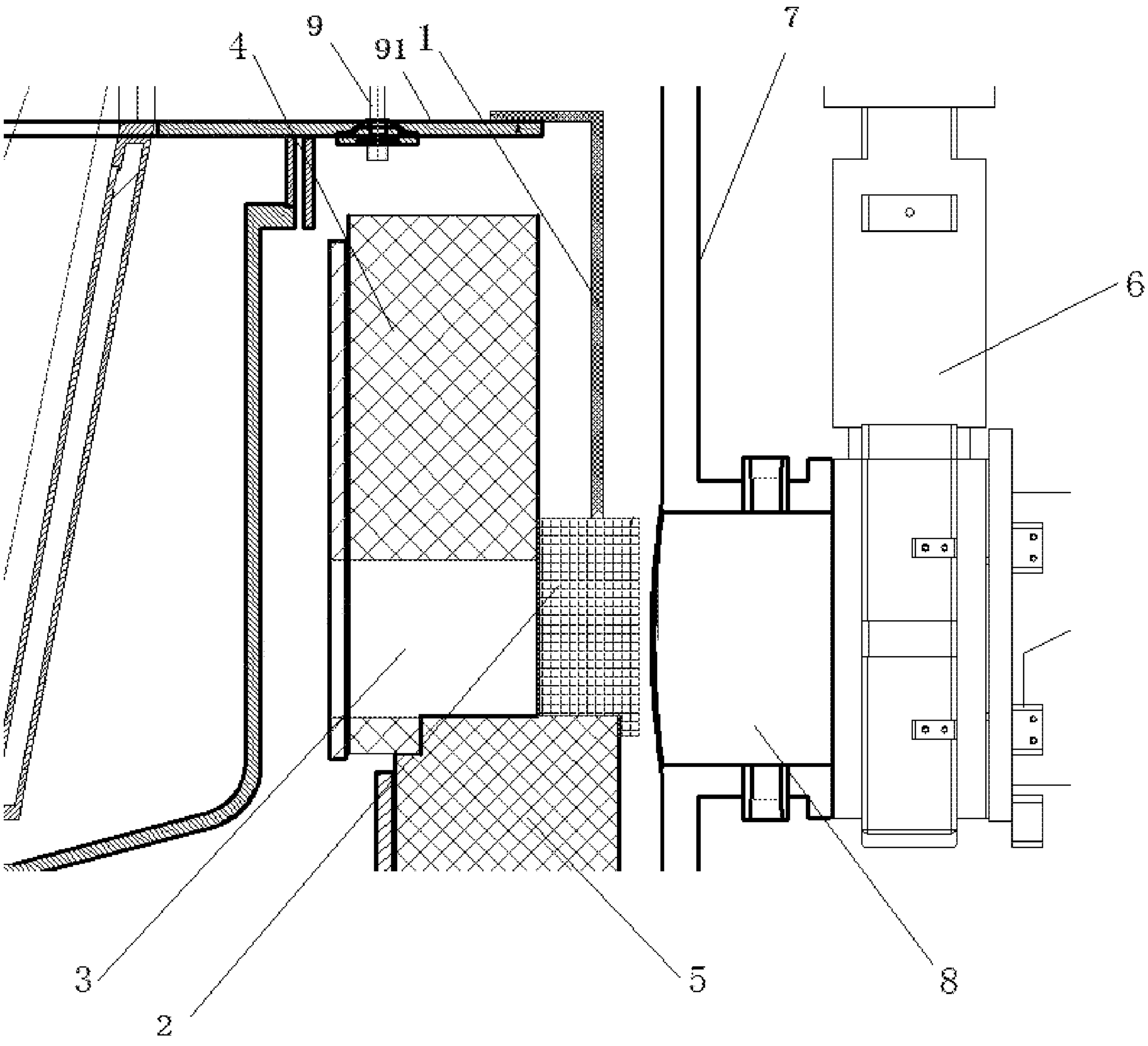
FIG. 1 is a schematic view showing a structure of a heat leakage prevention device when installed with a single crystal furnace according to an embodiment of the present disclosure.

| | | |
|---|---|---|
| 1. Connecting member | 2. Plugging member | 3. Thermal field open |
| 4. Upper insulating layer | 5. middle insulating layer | 6. external recharging device |
| 7. Single crystal furnace | 8. First open | 100. Main body |
| 101. Protrusion | 200. First connecting rod | 201. Second connecting rod |
| 9.guide cylinder lifting mechanism | 10.thermal field structure | 11.plugging device |
| 91.cover plate | | |

DETAILED DESCRIPTION OF EMBODIMENTS

In the present disclosure, unless otherwise clearly defined and limited, orientations or position relationships indicated by a term such as “length”, “width”, “thickness”, “upper”, “lower”, “front”, “rear”, “left”, “right”, “vertical”, “horizontal", "top", "bottom", "inside", "outside", is based on orientations or position relationships illustrated in the drawings. The term is used to facilitate and simplify the description of the present disclosure, rather than indicate or imply that the devices or elements referred to herein are required to have specific orientations or be constructed or operate in the specific orientations. Accordingly, the term should not be construed as limiting the present disclosure.

The terms "mounted", "connected/coupled", and "connection" should be interpreted broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

It should be understood that in the embodiments of the present disclosure, well-known structures and processes will not be detailed to avoid unnecessary details to obscure the description of the present disclosure. Therefore, the present disclosure is not intended to be limited to the illustrated embodiments but is consistent with the widest scope that conforms to the principles and features disclosed in the present disclosure.

Generally, when a single crystal furnace is recharged through an external recharging device (i.e., material recharged into the single crystal furnace in a subsequent process), it is necessary to provide opens in a wall of the single crystal furnace and in a thermal field structure, which is, for example, a thermal insulation layer structure around the periphery of the single crystal furnace, such as a thermal insulation cylinder, a thermal insulation felt, so as to transfer material into the single crystal furnace through the external recharging device, thereby achieving material recharging. However, the opens in the thermal field structure may lead to deterioration of the thermal insulation layer structure, causing heat loss, and changing the air flow direction in the single crystal furnace, thereby affecting power consumption and crystal formation. To solve the above problems, the present disclosure provides a heat leakage prevention device. A plugging device in the heat leakage prevention device is movably arranged on one side of the opening of the heat field structure. After the material is recharged, the open of the heat field structure is plugged by the plugging device, so that the heat field structure at this time is the same as the unopened heat field structure, avoiding that the heat insulation of the hot field structure deteriorates through the opening, avoiding heat loss, and ensuring that the direction of the airflow in the single crystal furnace does not change.

Figure 2:
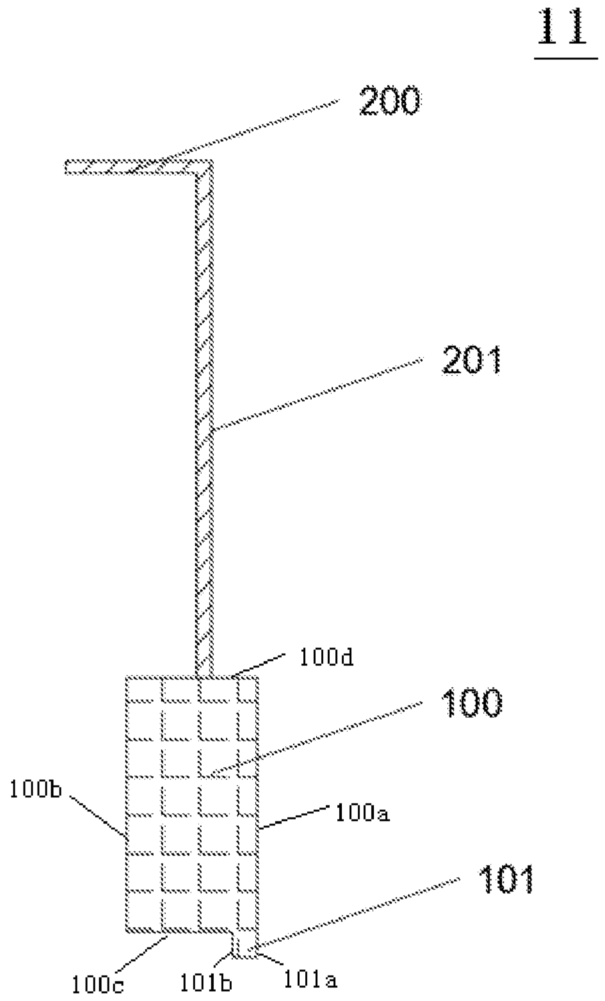
FIG. 2 is a schematic structural diagram of a plugging device in a heat leakage prevention device according to an embodiment of the present disclosure.
Figure 3:
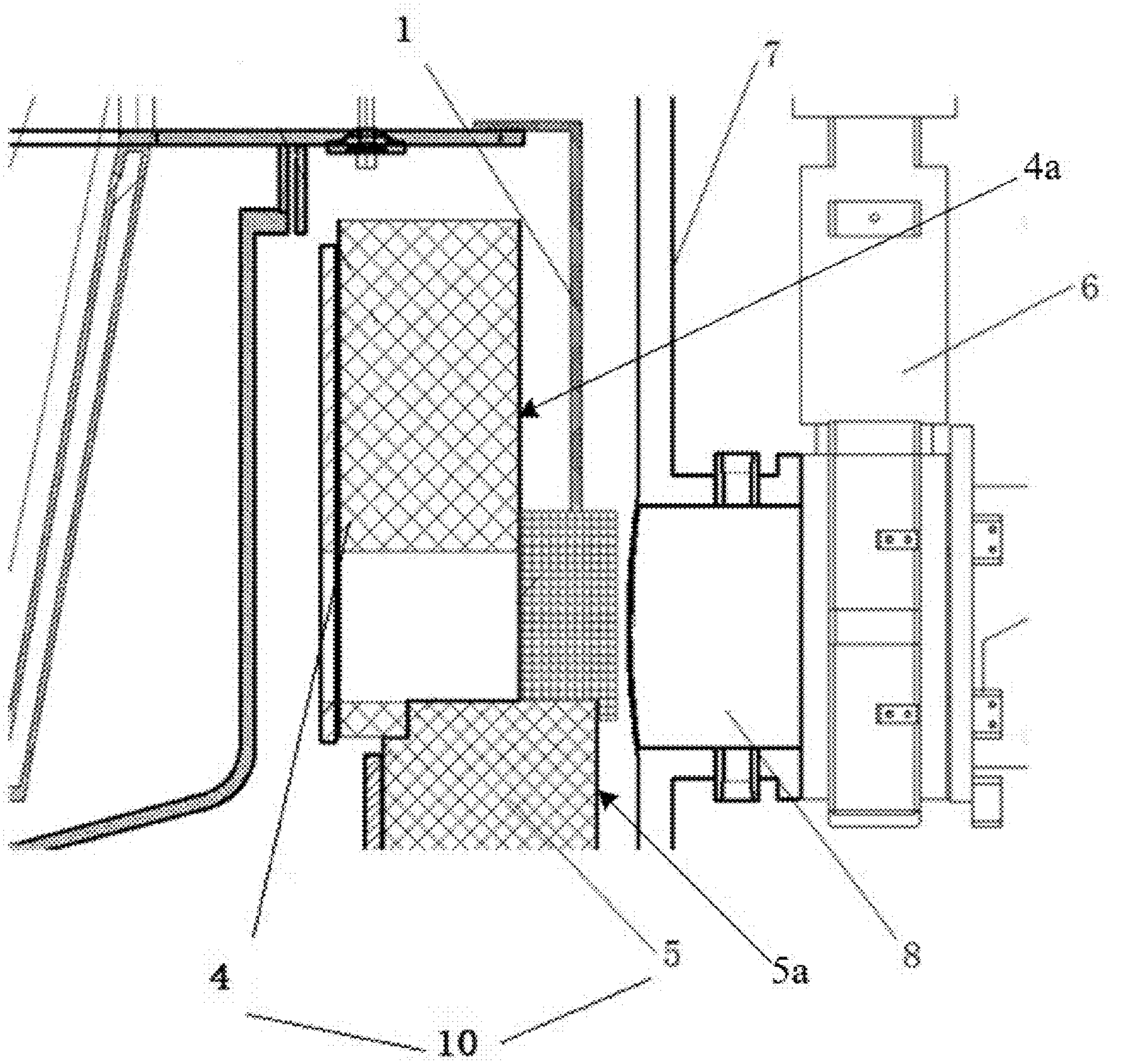
FIG. 3 is a schematic structural diagram of a thermal field structure in a heat leakage prevention device according to an embodiment of the present disclosure.

In an embodiment of the present disclosure, there is provided a heat leakage prevention device suitable for a single crystal furnace, as shown in FIGS. 1 to 3, wherein FIG. 1 shows a schematic structural diagram of a heat leakage prevention device installed in a single crystal furnace according to an embodiment of the present disclosure, FIG. 2 shows a schematic structural diagram of a plugging device of a heat leakage prevention device according to an embodiment of the present disclosure, and FIG. 3 shows a schematic structural diagram of a thermal field structure in a heat leakage prevention device of an embodiment of the present disclosure. Referring to FIGS. 1 and 3, provided is a heat leakage prevention device inside a single crystal furnace 7 at a location adjacent to an outside wall of the single crystal furnace, which includes a thermal field structure 10 and a plugging device 11. The plugging device 11 includes a plugging member 2 and a connecting member 1, wherein the plugging member 2 is connected to one end of the connecting member 1, and the other end of the connecting member 1 is connected to a guide cylinder lifting mechanism 9. A thermal field open 3 is disposed on the thermal field structure 10, and the plugging member 2 is located on one side of the thermal field open 3 for plugging or exposing the thermal field open 3. During recharging, the plugging member 2 moves under the action of the guide cylinder lifting mechanism 9, until the plugging member 2 is far away from the thermal field open 3 and does not plug the thermal field open 3. An external recharging device 6 performs recharging of materials through the thermal field open 3. After the recharging is completed, the plugging member 2 further moves under the action of the guide cylinder lifting mechanism 9, approaches the thermal field open 3, moves to one side of the thermal field open 3, and plugs the thermal field open 3 to ensure that the thermal insulation of the thermal field structure does not change during the crystal pulling process, thereby avoiding heat loss, and maintaining the direction of airflow in the single crystal furnace 7 unchanged, without affecting power consumption and crystal formation during the crystal pulling process.

Referring to FIG. 2, the plugging member 2 includes a main body 100 and a protrusion 101. The main body 100 is connected to the protrusion 101, and the protrusion 101 is disposed on one side of the main body 100. The connecting member 1 is connected to a side opposite to one side of the main body 100 on which the protrusion 101 is disposed. For example, the main body 100 has a first side 100*a* close to the single crystal furnace 7, a second side 100*b* facing the thermal field open 3, a third side 100*c* provided with a protrusion 101, and a fourth side 100*d* connected to the connecting member 1. After the materials are recharged, the main body 100 plugs the thermal field open 3, and the protrusion 101 is used for positing during the movement of the plugging device 11, so that the plugging device 11 can accurately move to one side of the thermal field open 3 and closes the thermal field open 3. The protrusion 101 and the connecting member 1 are located on a set of opposite sides of the main body 100, respectively. When the plugging device 11 moves toward the thermal field open 3, the protrusion 101 first contacts the thermal field structure 10 until the main body 100 contacts the thermal field structure 10, so that the main body 100 plugs the thermal field open 3. In order to enable the main body 100 to be in close contact with the side wall of the thermal field structure 10, to close the thermal field open 3, to avoid heat loss, to ensure that the thermal insulation of the thermal field structure 10 remains unchanged, the shape of the second side 100*b* of the main body 100 coincides with the shape of the corresponding side wall of the thermal field structure 10, so that when the plugging member 2 closes the thermal field open 3, the second side 100*b* of the main body 100 is in close contact with the side wall of the thermal field structure 10 without a gap, to avoid heat loss during crystal pulling, to ensure that the direction of the air flow in the single crystal furnace 7 remains unchanged during crystal pulling.

In the embodiments of the present disclosure, the main body 100 may have various structures, for example, a block-like structure having a cross-sectional shape such as square, rectangular, curved, or other shapes, which are selectively according to actual requirements and are not specifically defined herein. Preferably, in the present embodiment, the main body 100 is a curved-shaped block structure such that the main body 100 is in close contact with a corresponding side of the thermal field structure 10.

Referring to FIG. 2, the protrusion 101 is disposed on the third side 100*c* of the main body 100 in a protruding manner. The protrusion 101 may be fixedly connected to the main body 100. Preferably, the protrusion 101 is integrally formed with the main body 100, so that the structure of the plugging member 2 is stable and the service life thereof is long. One side of the protrusion 101 is flush with the first side 100*a* of the main body 100. For example, referring to FIG. 2, the first side 101*a* of the protrusion 101 faces the single crystal furnace 7, the second side 101*b* of the protrusion 101 faces the thermal field open 3, and the first side 101*a* of the protrusion 101 is flush with the first side 100*a* of the main body 100 so that the protrusion 101 is L-shaped with the third side of the main body 100.

In an embodiment of the present disclosure, the area of the second side 100*b* of the body 100 is larger than the area of the thermal field open 3 so that the plugging member 2 can completely plug the thermal field open 3. For example, referring to FIG. 1, the side 100*b* of the plugging member 2 coincides with the side wall of the thermal field structure 10 above the thermal field open 3 by a certain length, so that the thermal field open 3 is completely plugged, and there is no gap between the thermal field open 3 and the main body 100, thereby avoiding heat loss from the thermal field open 3.

Referring to FIG. 3, the thermal field structure 10 described above includes an upper insulating layer 4 and a middle insulating layer 5. The thermal field open 3 is disposed at the lower end of the upper insulating layer 4 and exposes the upper surface of the middle insulating layer 5. A first side 4*a* of the upper insulating layer 4 faces the single crystal furnace 7, and a first side 5*a* of the middle insulating layer 5 faces the single crystal furnace 7. The first side 5*a* of the middle insulating layer 5 protrudes toward the single crystal furnace 7 with respect to the first side 4*a* of the upper insulating layer 4.

The thickness of the main body 100 (that is, a length in a horizontal direction) is larger than a protruding length of the first side surface 5*a* of the middle insulating layer 5, so that the protrusion 101 is in contact with the first side 5*a* of the middle insulating layer 5 when the plugging member 2 plugs the thermal field open 3, thereby plugging the gap at the contact between the main body 100 and the middle insulating layer 5 to avoid heat loss.

In the embodiments of the present disclosure, when plugging the thermal field open 3 by the plugging member 2, the main body 100 plugs the thermal field open 3, and the second side 100*b* of the main body 100 is in contact with the side wall of the upper insulation layer 4, and partially coincides with each other. The third side face 100*c* of the main body 100 provided with the protrusion 101 is in contact with the middle insulation layer 5, and the main body 100 is located on the top of the middle insulation layer 5, and the protrusion 101 is in contact with the first side 5*a* of the middle insulation layer 5 to realize a complete plugging of the thermal field open 3, and no heat loss due to the gap between the plugging member 2 and the upper insulation layer 4 and the middle insulation layer 5, respectively.

Preferably, the material of the plugging member 2 may be consistent with the material of the upper insulating layer 4 so that no new impurities are introduced during the pulling of the single crystal to ensure the quality of the single crystal.

In order to enable the main body 100 to completely plug the thermal field open 3, the main body 100 is in close contact with the upper insulating layer 4 and the middle insulating layer 5. In the embodiments of the present disclosure, the main body 100 is vertically disposed in parallel with the upper insulating layer 4.

In embodiments of the present disclosure, the connecting member 1 may have various configurations. For example, referring to FIG. 2, the above-mentioned connecting member 1 has a rod-like structure and includes a first connecting rod 200 and a second connecting rod 201, wherein one end of the first connecting rod 200 is connected to one end of the second connecting rod 201, the other end of the first connecting rod 200 is connected to the guide cylinder lifting mechanism 9, and the other end of the second connecting rod 201 is connected to the plugging member 2, so that the plugging member 2 moves up and down in the vertical direction without causing damage to the upper insulating layer 4 and the single crystal furnace 7. The second connecting rod 201 is vertically arranged, and the first connecting rod 200 and the second connecting rod 201 are intersected so that the first connecting rod 200 can be connected to the guide cylinder lifting mechanism 9. In this embodiment, the first connecting rod 200 and the second connecting rod 201 are vertically arranged. It should be noted that the specific structure of the connecting member of the present disclosure is not limited thereto, but encompasses any structure known to those skilled in the art capable of performing this function.

When the first connecting rod 200 is connected to the guide cylinder lifting mechanism 9, the first connecting rod 200 is connected to a cover plate 91 of the guide cylinder lifting mechanism 9 so that the plugging device can be lifted with the lifting of the cover plate 91.

The present disclosure also provides a single crystal furnace system including a guide cylinder lifting mechanism 9, a single crystal furnace 7, and a heat leakage prevention device as described above. Referring to FIG. 1, the thermal field structure 10 is provided with a thermal field open 3, and the side wall of the single crystal furnace 7 is provided with a first open 8. A position of the first open 8 corresponds to a position of the thermal field open 3, so that the external recharging device 6 can supply materials into the single crystal furnace 7 through the thermal field open 3 and the first open 8 in sequence to perform recharging of materials. The plugging device 11 is connected to the guide cylinder lifting mechanism 9 so as to plug the thermal field open 3 after the recharging of materials is completed. The plugging device 11 is raised with the lifting of the guide cylinder lifting mechanism 9 and is dropped with the lowering of the guide cylinder lifting mechanism 9. Therefore, the structure is simple, and the volume of space occupied by the plugging device 11 in the single crystal furnace 7 is reduced. Therefore, it is not necessary to improve the structure of the single crystal furnace 7 and the thermal field structure, thereby reducing the production cost.

The plugging device 11 provided in the present disclosure is disposed between the thermal field structure 10 and the side wall of the single crystal furnace 7 and does not contact a guide cylinder.

According to an embodiment of the present disclosure, the plugging device 11 is used for plugging the thermal field open 3 when there is no need to recharge the materials. Rather, when there is a need to recharge the materials, the guide cylinder lifting mechanism 9 is operated to drive the plugging device 11 to rise, and the plugging member 2 is away from the thermal field open 3 and does not plug the thermal field open 3. Then, the external recharging device 6 is operated, so that the materials are sequentially supplied to the single crystal furnace 7 through the thermal field open 3 and the first open 8 in the furnace wall of the single crystal furnace 7, and the external recharging device 6 supplies the materials to the interior of the single crystal furnace 7 for recharging. After the recharging is completed, the guide cylinder lifting mechanism 9 continues to operate to drive the plugging device 11 to descend, so that the plugging member 2 descends, and the plugging member 2 moves to the thermal field open 3. At this time, the second side 100*b* of the main body 100 is in contact with the side wall of the upper thermal insulation layer 4, the third side 100*c* of the main body 100 is in contact with the top of the middle thermal insulation layer 5, and the second side 101*b* of the protrusion 101 is in contact with the side wall of the middle thermal insulation layer 5. As a result, the thermal field open 3 is plugged, heat loss of the thermal field structure 10 in the crystal pulling process is avoided, and it is ensured that the air flow in the single crystal furnace 7 does not change direction in the crystal pulling process and does not affect power consumption and crystal formation in the crystal pulling process.

According to the above technical solutions, the heat leakage prevention device is simple in structure and convenient to use. The plugging device 11 in the heat leakage prevention device is connected to the guide cylinder lifting mechanism 9, so that the plugging device 11 can move under the action of the guide cylinder lifting mechanism 9 and can be raised or dropped. When no recharging is performed, the plugging device 11 plugs the thermal field open 3, thereby avoiding heat loss in the crystal pulling process and changing the gas direction in the single crystal furnace 7, and ensuring that power consumption and crystal formation are not affected in the crystal pulling process. When the recharging is required, the plugging device 11 is lifted under the action of the guide cylinder lifting mechanism 9, so that the external recharging device 6 can supply materials to the single crystal furnace for recharging, and the external recharging device 6 does not contact with the guide cylinder. The guide cylinder lifting mechanism 9 can simultaneously drive the guide cylinder and the plugging device 11 to operate, ensuring that the recharging action is carried out.

According to an embodiment of the present disclosure, the plugging device 11 has the main body 100 and the protrusion 101. The area of the second side 100*b* of the main body 100 is larger than the area of the thermal field open 3, so that the main body 100 can completely plug the thermal field open 3. The main body 100 and the first side 4*a* of the upper insulating layer 4 have overlapping portions, thereby avoiding heat loss from a gap between the thermal field open 3 and the main body 100. The protrusion 101 closes the contact gap between the main body 100 and the middle insulating layer 5, so as to avoid heat loss from the contact gap and not generate heat leakage, and ensure that the direction of the air flow in the single crystal furnace 7 is not changed.

The embodiments of the present disclosure have been described in detail above, but are merely preferred embodiments of the disclosure and are not to be considered as limiting the scope of practice of the disclosure. All equivalents and modifications made in accordance with the scope of the present disclosure shall remain within the scope of the present disclosure.

What is claimed is:

1. A heat leakage prevention device for a single crystal furnace, wherein the heat leakage prevention device comprises a thermal field structure and a plugging device disposed inside the single crystal furnace at a location adjacent to an outside wall of the single crystal furnace, the plugging device comprises a plugging member, the plugging member comprises a main body and a protrusion connected to the main body, the protrusion is disposed on one side of the main body, the thermal field structure is provided with a thermal field opening for feeding the single crystal furnace, the main body is disposed on a side of the thermal field opening facing a first opening of the single crystal furnace, and the first opening corresponds to the thermal field opening; and wherein the main body is movably disposed to expose or completely plug the thermal field opening;

wherein the thermal field structure comprises an upper thermal insulation layer and a middle thermal insulation layer located below the upper thermal insulation layer, the thermal field opening is provided between the upper thermal insulation layer and the middle thermal insulation layer, a side surface of the middle insulation layer facing the first opening is closer to the first opening than a side surface of the upper insulation layer facing the first opening, and a side surface of the protrusion away from the first opening is in contact with the side surface of the middle insulation layer facing the first opening.

2. The heat leakage prevention device according to claim 1, wherein the protrusion is configured to position the main body at the thermal field opening, and a shape of the main body is matched with a shape of a corresponding side of the thermal field structure to completely plug the thermal field opening.

3. The heat leakage prevention device according to claim 2, wherein an area of a side surface of the main body facing the thermal field opening is larger than an area of the thermal field opening.

4. The heat leakage prevention device according to claim 2, wherein the protrusion is disposed at a lower end of the main body, and the protrusion is configured to contact a portion of the thermal field structure below the thermal field opening when the plugging device moves in a vertical direction.

5. The heat leakage preventing device according to claim 4, wherein the protrusion is concave in a direction away from the thermal field opening with respect to the main body.

6. The heat leakage preventing device according to claim 5, wherein a concave portion of the protrusion is matched with a convex portion of the middle insulating layer, and a length of the concave portion is equal to a length of the convex portion.

7. The heat leakage prevention device according to claim 1, wherein the plugging device further comprises a connecting member, and wherein one end of the connecting member is connected to a device for moving it, another end of the connecting member is connected to the plugging device, and the connecting member extends in a vertical direction to guide the plugging device to move in the vertical direction.

8. The heat leakage prevention device according to claim 5, wherein a material of the plugging device is same as a material of the upper thermal insulation layer.

9. The heat leakage prevention device according to claim 1, wherein in a top view, the thermal field opening is not overlapped with the main body.

10. The heat leakage prevention device according to claim 1, wherein a side surface of the protrusion facing the first opening is flush with a side surface of the main body facing the first opening.

11. A single crystal furnace system comprising a guide cylinder lifting mechanism, a heat leakage prevention device, and a single crystal furnace, wherein the heat leakage prevention device comprises a thermal field structure and a plugging device disposed inside the single crystal furnace at a location adjacent to an outside wall of the single crystal furnace the plugging device comprises a plugging member, the plugging member comprises a main body and a protrusion connected to the main body, the protrusion is disposed on one side of the main body, the thermal field structure is provided with a thermal field opening for feeding the single crystal furnace, the main body is disposed on a side of the thermal field opening facing a first opening of the single crystal furnace, and wherein the plugging device is movably disposed to expose or completely plug the thermal field opening;

- wherein the guide cylinder lifting mechanism is disposed at an upper end of the heat leakage preventing device, the guide cylinder lifting mechanism comprises a cover plate, and the cover plate is connected to the plugging device to guide the plugging device to move; and
- wherein the single crystal furnace is disposed in a side of the heat leakage prevention device and is provided with the first opening at a position corresponding to a position of the thermal field opening; and
- wherein the thermal field structure comprises an upper thermal insulation layer and a middle thermal insulation layer located below the upper thermal insulation layer, the thermal field opening is disposed between the upper thermal insulation layer and the middle thermal insulation layer, a side surface of the middle insulation layer facing the first opening is closer to the first opening than a side surface of the upper insulation layer facing the first opening, and a side surface of the protrusion away from the first opening is in contact with the side surface of the middle insulation layer facing the first opening.

12. The single crystal furnace system according to claim 11, wherein the protrusion is configured to position the main body at the thermal field opening, and a shape of the main body is matched with a shape of a corresponding side of the thermal field structure to completely plug the thermal field opening.

13. The single crystal furnace system according to claim 12, wherein an area of a side surface of the main body facing the thermal field opening is larger than an area of the thermal field opening.

14. The single crystal furnace system according to claim 12, wherein the protrusion is disposed at a lower end of the main body, and the protrusion is configured to contact a portion of the thermal field structure below the thermal field opening when the plugging device moves in a vertical direction.

15. The single crystal furnace system according to claim 14, wherein the protrusion is concave in a direction away from the thermal field opening with respect to the main body.

16. The single crystal furnace system according to claim 15, wherein a concave portion of the protrusion is matched with a convex portion of the middle insulating layer, and a length of the concave portion is equal to a length of the convex portion.

17. The single crystal furnace system according to claim 11, wherein the plugging device further comprises a connecting member, and wherein one end of the connecting member is connected to a device for moving it, another end of the connecting member is connected to the plugging device, and the connecting member extends in a vertical direction to guide the plugging device to move in the vertical direction.

18. The single crystal furnace system according to claim 15, wherein a material of the plugging device is same as a material of the upper thermal insulation layer.

19. The single crystal furnace system according to claim 17, wherein the connecting member comprises a first connecting rod and a second connecting rod, one end of the first connecting rod is connected to one end of the second connecting rod, the other end of the first connecting rod is connected to the guide cylinder lifting mechanism, and the other end of the second connecting rod is connected to the plugging member.

20. The single crystal furnace system according to claim 19, wherein the connecting member and the protrusion are respectively located on two opposite sides of the main body.

* * * * *